US012316067B2

(12) United States Patent
Song

(10) Patent No.: US 12,316,067 B2
(45) Date of Patent: *May 27, 2025

(54) APPARATUS FOR PROJECTING LINEAR LASER BEAMS

(71) Applicant: Liturex (Guangzhou) Co. Ltd., Guangzhou (CN)

(72) Inventor: Yunpeng Song, San Ramon, CA (US)

(73) Assignee: Liturex (Guangzhou) Co. Ltd., Guangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/544,304

(22) Filed: Dec. 18, 2023

(65) Prior Publication Data

US 2024/0128707 A1 Apr. 18, 2024

Related U.S. Application Data

(63) Continuation of application No. 17/030,138, filed on Sep. 23, 2020, now Pat. No. 11,909,169.

(60) Provisional application No. 62/958,251, filed on Jan. 7, 2020.

(51) Int. Cl.
| | |
|---|---|
| *H01S 5/00* | (2006.01) |
| *G01S 7/481* | (2006.01) |
| *G02B 26/08* | (2006.01) |
| *H01S 5/40* | (2006.01) |
| *G02B 19/00* | (2006.01) |

(52) U.S. Cl.
CPC .......... *H01S 5/0071* (2013.01); *G01S 7/4815* (2013.01); *G02B 26/0833* (2013.01); *H01S 5/4012* (2013.01); *H01S 5/4075* (2013.01); *G02B 19/0057* (2013.01)

(58) Field of Classification Search
CPC .... H01S 5/0071; H01S 5/4012; H01S 5/4075; G01S 7/4815; G01S 7/4817; G02B 26/0833; G02B 19/0057; G02B 27/0972
See application file for complete search history.

(56) References Cited

U.S. PATENT DOCUMENTS

| | | | |
|---|---|---|---|
| 6,028,722 A * | 2/2000 | Lang | G02B 27/09 359/836 |
| 6,133,566 A | 10/2000 | Yamaguchi | |
| 11,909,169 B2 * | 2/2024 | Song | H01S 5/4012 |
| 2002/0171941 A1 | 11/2002 | Okada | |
| 2005/0069255 A1 | 3/2005 | Nishimura et al. | |
| 2013/0321823 A1 | 12/2013 | Takahashi | |
| 2014/0267528 A1 | 9/2014 | Imai | |
| 2019/0113200 A1 * | 4/2019 | Murakami | F21S 41/255 |

\* cited by examiner

*Primary Examiner* — Xinning(Tom) Niu
(74) *Attorney, Agent, or Firm* — Davis Wright Tremaine LLP

(57) ABSTRACT

In one embodiment, described herein is an apparatus for projecting linear illumination fanned out along the slow axis of a laser source array. In addition to the laser source array, the apparatus can include a number of fast axis collimators (FACs) to collimate the laser beams from the laser source array along the fast axis, a cylinder lens array for converting the collimated laser beams to parallel laser beams, and a prism array pair for reducing the pitch of the parallel laser beams. The system further includes a first cylinder lens for focusing the laser beams from the prism array pair onto a MEMS mirror, which redirects the laser beams as a linear laser beam towards a predetermined direction.

20 Claims, 6 Drawing Sheets

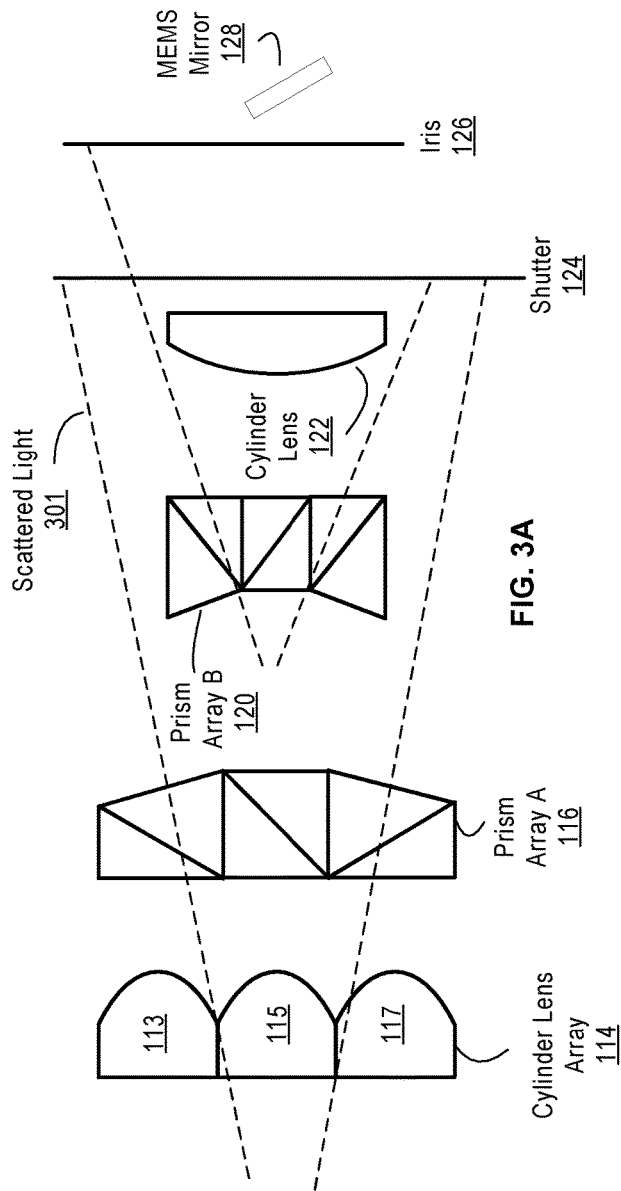
FIG. 3A
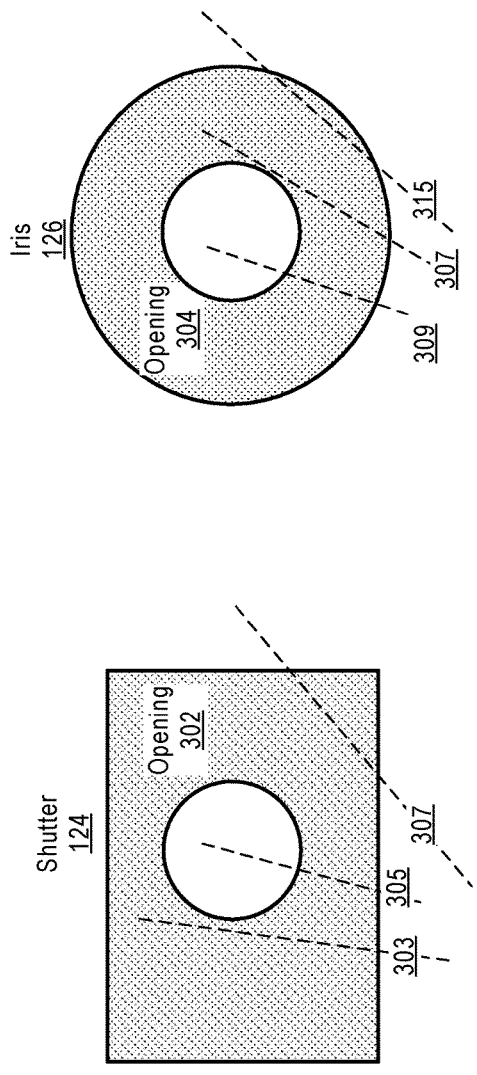
FIG. 3B
FIG. 3C

APPARATUS FOR PROJECTING LINEAR LASER BEAMS

CLAIM OF PRIORITY

This application is a continuation of U.S. patent application Ser. No. 17/030,138, filed Sep. 23, 2020, entitled "APPARATUS FOR PROJECTING LINEAR LASER BEAMS," which claims the benefit of U.S. Provisional Patent Application No. 62/958,251, filed Jan. 7, 2020, entitled "LASER DEVICE PROJECTING A LINE OF LIGHT FROM DIODE LASER ARRAYS." Both applications are herein incorporated by reference in their entireties.

TECHNICAL FIELD

Embodiments of the present invention relate generally to remote sensing, and more particularly relate to an apparatus and a method for projecting linear laser beams from a diode laser array.

BACKGROUND

A LiDAR device can measure distances to objects in an environment by illuminating the objects with laser pulses and measuring reflected pulses from the objects. A LiDAR device include a laser source to generate laser beams, which can be spot laser beams or line laser beams.

A LiDAR device projecting linear laser beams tends to be more efficient than a LiDAR device projecting spot laser beams, as the scanner in the former does not have to scan along two axes as the scanner does in the latter. However, linear laser beams typically have low intensity. Although a high-power single laser source can generate line laser beams with sufficient intensity, such a laser source may be prohibitively expensive.

SUMMARY

In one embodiment, described herein is an apparatus for projecting linear illumination fanned out along the slow axis of a laser source array. In addition to the laser source array, the apparatus can include a number of fast axis collimators (FACs) to collimate the laser beams from the laser source array along the fast axis, a cylinder lens array for converting the collimated laser beams to parallel laser beams, and a prism array pair for reducing the pitch of the parallel laser beams. The system further includes a first cylinder lens for focusing the laser beams from the prism array pair onto a MEMS mirror, which redirects the laser beams as a linear laser beam towards a predetermined direction.

BRIEF DESCRIPTION OF THE DRAWINGS

Embodiments of the disclosure are illustrated by way of example and not limitation in the figures of the accompanying drawings, in which like references indicate similar elements.

FIGS. 3A-3C further illustrate the apparatus according to one embodiment.

DETAILED DESCRIPTION

Figure 1:
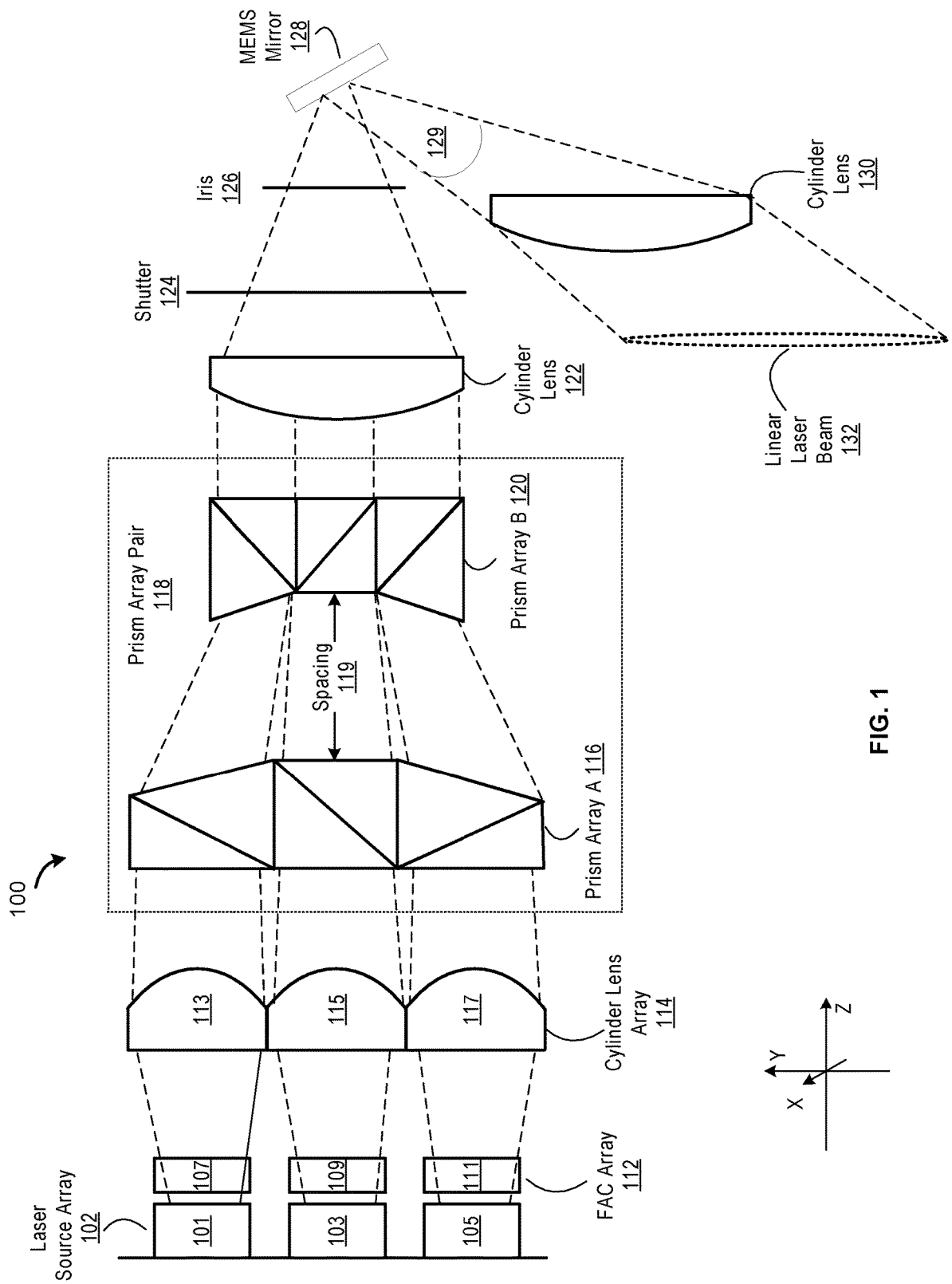
FIG. 1 shows an apparatus for projecting a linear laser beam from a diode laser array according to one embodiment.

The following description and drawings are illustrative and are not to be construed as limiting. Numerous specific details are described to provide a thorough understanding of various embodiments. However, in certain instances, well-known or conventional details are not described in order to provide a concise discussion of the embodiments.

According to various embodiments, described herein are apparatuses and methods for projecting linear laser beams using a diode laser array. In one embodiment, an exemplary apparatus for projecting linear laser beams can include a laser source array, a prism array pair, a first cylinder lens, and a microelectromechanical system (MEMS) mirror. The prism array pair can be positioned between the laser source array and the first cylinder lens to reduce the pitch between laser beams from the laser source array to a predetermined value. The first cylinder lens can focus the laser beams from the prism array pair onto the MEMS mirror, which redirects the laser beams as a linear laser beam towards a predetermined direction.

In one embodiment, the apparatus further includes a number fast axis collimators (FACs), and each FAC is coupled with one of many laser sources in the laser source array to collimate a laser beam from the laser source along a fast axis. Each laser source itself is a diode laser array, and can include multiple laser diodes. Each laser source is driven by the same voltage, or a different voltage.

In one embodiment, the apparatus can further include a cylinder lens array positioned between the FACs and the prism array pair. The cylinder lens array is provided to convert the collimated laser beam from each laser source into a parallel laser beam along a slow axis.

In one embodiment, the prism array pair includes a first prism array and a second prism array that are separated by a spacing, and the spacing is based on a reduction of the pitch of the laser beams from the laser source array. The first prism array, which includes multiple sub-prisms, is shaped as a plano-convex prism, with the flat surface facing the cylinder lens array to receive the collimated and parallel laser beams from the cylinder lens array.

In one embodiment, the apparatus can include a second cylinder lens positioned at a predetermined distance from the MEMS mirror in the predetermined direction to adjust a divergent angle of the redirected linear laser beam from the MEMS mirror. The apparatus can further include a shutter positioned before the iris to keep scattered light from the MEMS mirror, and an iris positioned between the shutter and the MEMS mirror to keep scattered light—that the shutter fails to block—away from the MEMS mirror.

In one embodiment, the apparatus can be used as a laser pulse emitting unit in a light detection and ranging (LiDAR) device.

In one embodiment, the application also discloses a method of projecting a linear laser beam. The method includes reducing, using a prism array pair, a pitch of laser beams generated by a laser source array to a predetermined value; focusing the laser beams from the prism array pair on a microelectromechanical system (MEMS); and directing, by the MEMS mirror, the laser beams towards a predetermined direction as a linear laser beam towards a predetermined direction.

The above summary does not include an exhaustive list of all embodiments in this disclosure. All apparatus and methods in this disclosure can be practiced from all suitable combinations of the various aspects and embodiments described in the disclosure.

FIG. 1 shows an apparatus 100 for projecting a linear laser beam from a diode laser array according to one embodiment.

The apparatus 100 is configured to generate a linear laser beam 132 from a laser source array 102 that includes multiple laser diode packages 101, 103, and 105. The linear laser beam 132 can be a uniform illumination linearly fanned out along the slow axis with a predetermined divergent angle (e.g., 12 degrees) 129.

To generate such a uniform illumination, each component in the apparatus 100 needs to be carefully crafted and configured for laser beams from the laser source array 102 to be converged onto a MEMS mirror 128.

In one embodiment, the apparatus 100 includes a number of fast axis collimators (FACs) 113 115, and 117 in an FAC array 112, and each FAC is coupled to a laser source to collimate a laser beam from that laser source along the fast axis. The laser beam along the fast axis has a larger divergence angle and a lower height than the laser beam along the slow axis, and therefore is easier to be collimated. In FIG. 1, the fast axis is the X axis and the slow the axis is the Y axis.

The apparatus 100 further includes a cylinder lens array 114 to convert the collimated beams from the FACs 113, 115, and 117 into parallel laser beams along the Y axis. The cylinder lens array 114 includes multiple sub-cylinder lens 113, 115, and 117, and can be fabricated from a single piece of glass or plastic or other suitable material. The number of sub-cylinder lens 113, 115, and 117 in the cylinder lens array 114 is equal to the number of laser sources 101, 103, and 105 in the laser source array 102, and the pitch of the cylinder lens array 114 is also the same as the separation pitch between neighboring laser sources of the laser source array 102 along the slow axis.

In one embodiment, the apparatus 100 further includes a prism array pair 118 that functions as a pitch converter for the laser beams from the cylinder lens array 114. The pitch of the laser beams from the cylinder lens array 114 needs to be reduced so that the laser beams can be converged by a cylinder lens 122 onto the MEMS mirror 128. The pitch converter can reduce the beam size at the location of the MEMS mirror 128 such that the MEMS mirror 128 can have a small size. A smaller MEMS mirror generally is more robust against mechanical vibrations and tends to have a larger deflection anger than a larger MEMS mirror.

As shown, the prism array pair 118 can include two prism arrays 116 and 120. Each prism array is fabricated from a single piece of glass or plastic or other materials, and can include multiple sub-prisms. The first prism array 116 is shaped as a plano-convex prism, and the second prism array 120 is shaped as a plano-concave prism. The two prism arrays 116 and 120 can be separated by a spacing 119 that can be calculated based on a reduction of the pitch of the laser beams from the laser source array 102. Further, the spacing 119 between the two prism arrays 116 and 130 is optimized to minimize scatter light.

In one implementation, the separation pitch of laser beams from the laser source array 102 is 4.7 mm, and the reduced pitch of the converted laser beams is 2.8 mm. The two prism arrays 116 and 120 can be separated by a spacing (e.g., 10 mm) 119 that is proportional to the pitch reduction in the laser beams. If the separation pitch of the laser beams is larger, a larger spacing would be needed for the prism array pair 118 to reduce the larger pitch to 2.8 mm. The prism array pair 118 can make the whole configuration of the apparatus 100 substantially compact, and reduce the burden of focusing laser beams separated by a large pitch (i.e., the separation pitch of the laser source array 102) onto an MEMS with a small diameter aperture. In addition, the pitch conversion can increase the uniformity of the output.

In one embodiment, the ratio of focal lengths between the cylinder lens array 114 and the cylinder lens 122 can be configured because the ratio can affect the divergence of laser beams from the laser sources 101, 103, and 105, and also affects the image size from each laser source, which includes multiple laser diodes packaged together.

A higher such ratio can lead to a larger divergence of the laser beam from each laser source in the laser source array 102. Each laser beam from the laser source array 102 is a launching sub-beam for the linear laser beam 132. Therefore, the divergence of each sub-beam determines the divergence of the linear laser beam 132.

Further, the magnification of the image of each laser source can be determined by the ratio of focal lengths between the cylinder lens array 114 and the cylinder lens 122. By way of example, the laser source array 102 includes 3 laser sources, each laser source includes 4 sub-diodes, and the diameter of the laser spot from each sub-diode is 312 μm. Further by way of example, the focus length (f1) of each sub-cylinder lens in the cylinder lens array 114 is 15 mm, and the focal length (f2) of the cylinder lens 122 is 20 mm. With the above specifications, the length of the image size on the MEMS mirror 128 of each laser source is approximately 20 mm/15 mm*4*312 μm=1.67 mm along the slow axis.

In one embodiment, the back focal length of the cylinder lens 122 can have a focal length (e.g., 17.36 mm) between f1 and f2. Such a back focal length, coupled with different focusing between the marginal and paraxial rays by the single cylinder lens 122, would prevent the images from the different laser sources 101, 103, and 105 from being overlapped to improve uniformity of the output.

In one embodiment, the apparatus 100 can further include an iris 126 and/or a shutter 124. The shutter 125 can be placed after the cylinder lens 122 to prevent scattered light from getting close to the MEMS mirror 128. Scattered light can generate background light for LiDAR detection, and also cause higher power loss for the illumination. The iris 126 can be placed before the MEMS mirror 128 and after the shutter 124 to block scattered light that the shutter 126 fails to block.

In one embodiment, flat substrate of the MEMS mirror 128 can be partially covered with metal and bonded with wires. The flat substrate can be covered with a diameter aperture to prevent the flat substrate from generating background light. The redirected linear laser beam 132 is collimated along the X axis (i.e., the fast axis in this application) and has a divergence 129 along the Y axis (i.e., the slow axis).

In one embodiment, the divergent angle 129 can be changed to meet different requirements in actual implementation. For example, a cylinder lens 130 can be used to reshape the laser line 132 to change the divergent angle 129.

Figure 2:
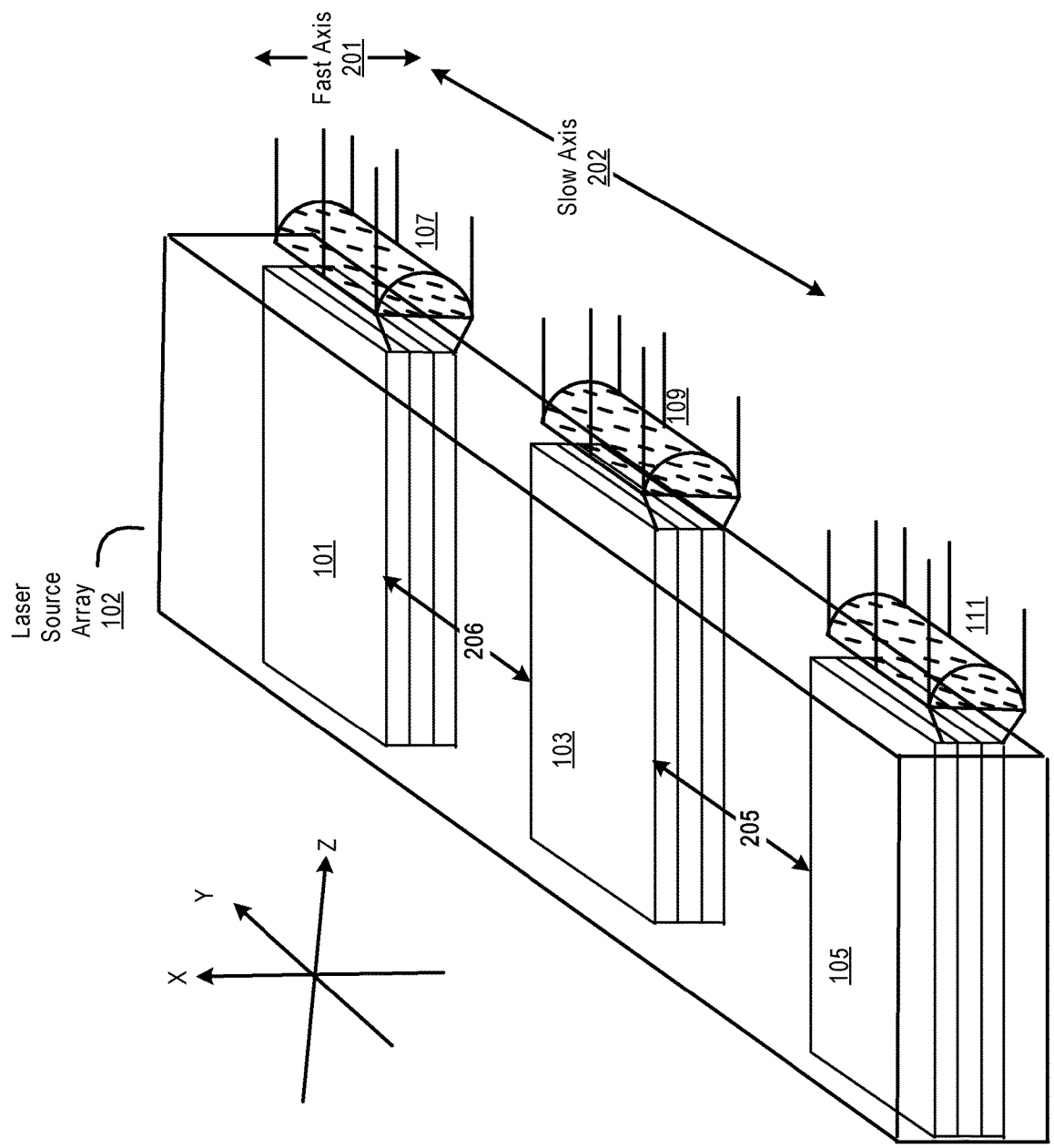
FIG. 2 illustrates an example of a laser source array according to one embodiment.

FIG. 2 illustrates an example of the laser source array 102 according to one embodiment.

As shown in FIG. 2, each of the laser sources 101, 103 and 105 can include a number of laser diodes (also referred to as laser bars) packaged together. Each of the laser sources 101, 103, and 105 is an integrated laser diode. The three laser sources are equally spaced, with a separation pitch between a separation 105 between the laser source 103 and the laser source 105, and a separation pitch 206 between the laser source 101 and the laser source 104. In one embodiment, the separation pitches 205 and 206 are equal.

In one embodiment, the laser source array 102 has several advantages over a laser source array comprising a single laser source, even if the latter may include the same number of laser bars.

For example, the laser source array 102 may include a total of 12 laser bars in 3 laser sources, with each laser source comprising 4 laser bars. Compared to another laser source array with all 12 laser bars packaged into one laser source, the laser source array 102 may be driven with a lower current, and may dissipate heat faster.

The number of laser sources 101, 103, and 105 and the number of sub diodes packed into each laser source are provided for illustration, and both the number of laser sources and the number of laser diodes in each laser source can vary in actual implementations.

In one embodiment, the laser sources 101, 103, and 105 can have the same number of laser diodes, and can be driven by the same voltage to generate laser beams of the same intensity. Alternatively, the laser sources 101, 103, and 105 are driven by different voltages, and generate laser beams of different intensities, with one or more laser sources in the middle of the laser source array 102 being driven by a higher voltage while the laser sources on both ends of the laser source array 102 being driven by a lower voltage. This embodiment can generate a laser line with an intensity profile that is practically useful yet energy efficient, as sub-beams on the both ends of a linear laser beam are less important when the linear laser beam falls on a target object at a long distance.

In the embodiment, the FACs 107, 109, and 111 that are coupled to the laser sources 101, 103 and 105 can collimate laser beams from the laser sources along the fast axis 201. The laser beams along the slow axis 202, however, are not collimated.

FIGS. 3A-3C further illustrate the apparatus 100 according to one embodiment. More specifically, FIGS. 3A-3C provide additional details regarding the scattered light, the shutter 124, and the iris 126.

As shown in FIG. 3A, scatter light 301 in the apparatus 100 can be generated from a variety of sources. One source of the scattered light 301 are sharp curves in the prism array 120 and the cyber lens array 114. The prism array 120 and the cylinder lens array 114 are both fabricated from a single piece of glass or plastic, and may contain sharp curves between different sub-prisms or sub-cylinder lens due to various limitations in the fabrication process. Another source of the scattered light 301 are bevels and edges of components in the apparatus 100. The scattered light 301 can create background light, which may interfere with the LIDAR detection, and cause higher power loss in the apparatus 100.

FIG. 3B represents a different view of the shutter 124, and FIG. 3C represents a different view of the iris 126. The shutter 124 bocks scatter light 303 such that the scattered light 303 is kept away from the circular aperture of the MEMS mirror 129 while allowing non-scattered light 305 to pass through an opening 302 on the shutter 124. Similarly, the iris 126 blocks scatter light 307 while allowing non-scattered light 309 to pass through an opening 304 on the iris 126. The scattered light 307 is scattered light that the shutter 124 fails to block, and can be blocked by the iris 126.

As shown in FIG. 3C, with the shutter 125 and the iris 126, there may still be some scattered light (e.g., scattered light 315) that is not blocked. However, such scattered light typically is far away from the circular aperture of the MEMS mirror 129, and may not impact the LiDAR detection.

Figure 4:
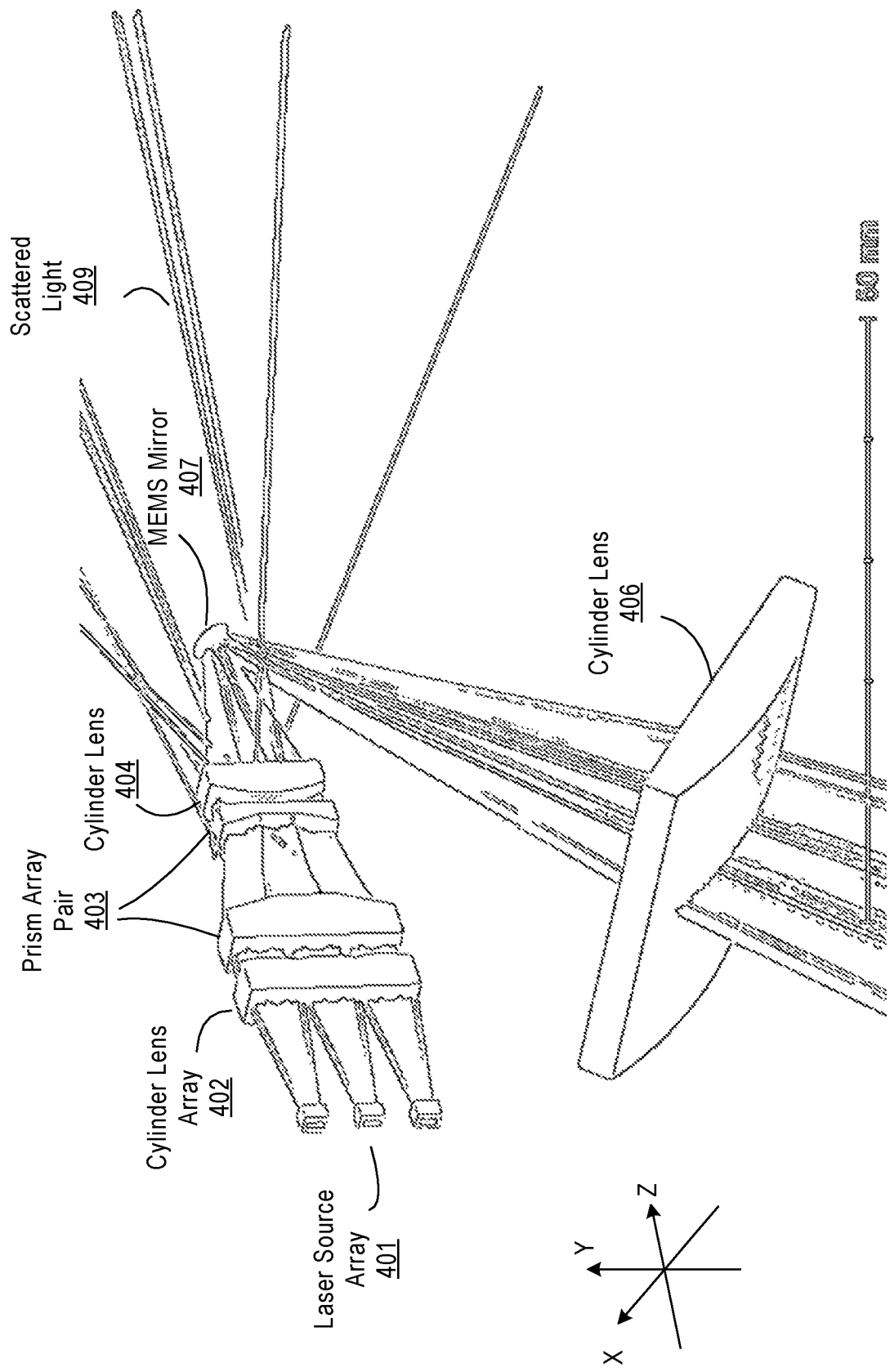
FIG. 4 illustrates an example of a beam path in the apparatus according to one embodiment.

FIG. 4 illustrates an example of a beam path in the apparatus 100 according to one embodiment. As shown in FIG. 4, a laser source array 401 can emit multiple laser beams that are collimated along the fast axis (i.e. X axis). The collimated laser beams can be focused on a prism array pair 403 by a cylinder lens array 402. The prism array pair 403 can reduce the pitch of the laser beams such that the laser beams are easier to be converged onto the MEMS mirror 407 by a cylinder lens 404. The MEMS mirror 407 can redirect the laser beam as a linear laser beam towards a desired direction. The redirected linear laser beam can be reshaped by a cylinder lens 406, which can adjust the divergent angle of the laser line based actual requirements in implementations. FIG. 4 does not show each component in the apparatus 100. For example, FIG. 4 does not show a shutter or an iris, which can be used to block scattered light 409 generated from the apparatus 100.

Figure 5:
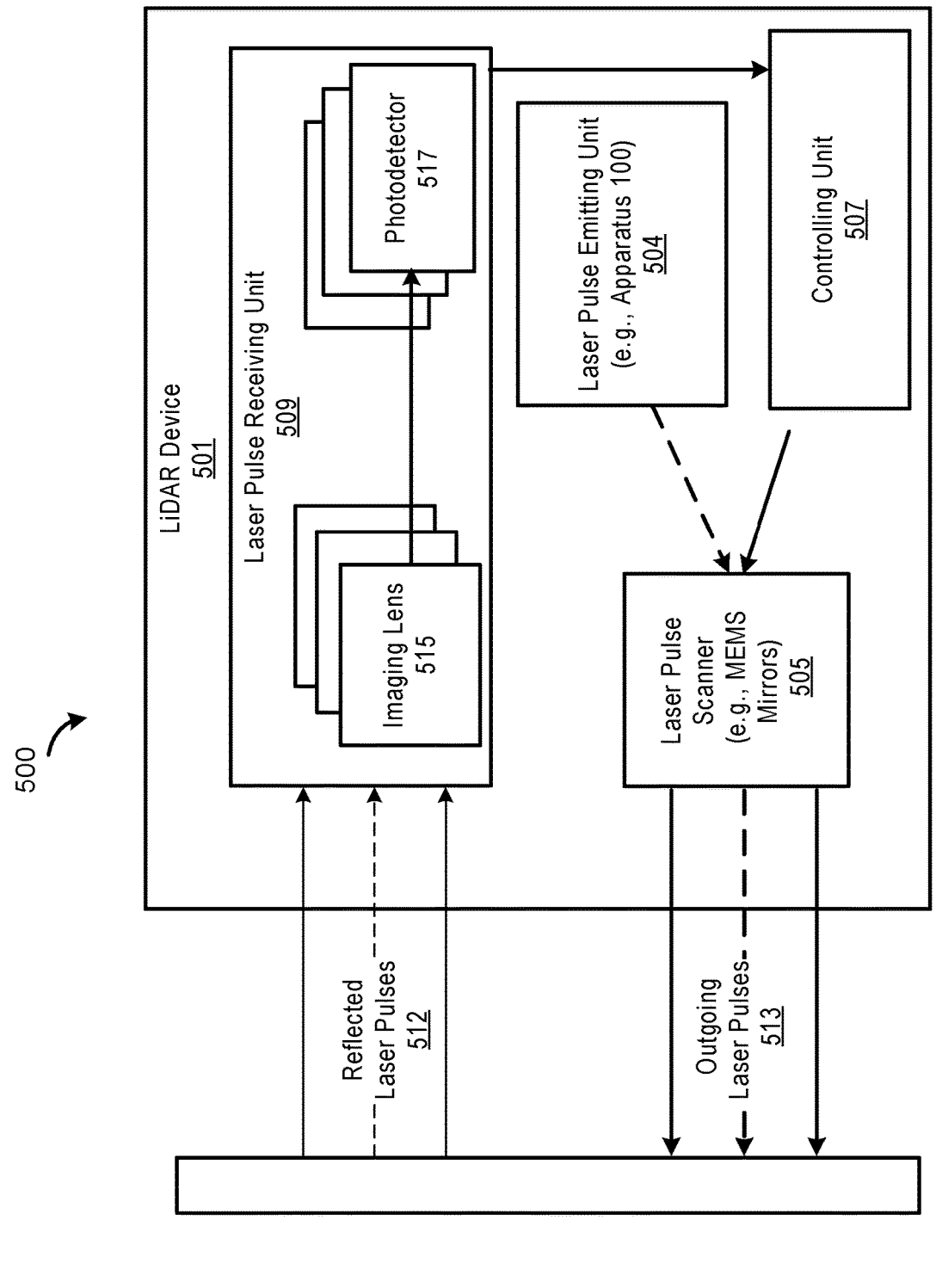
FIG. 5 illustrates a LiDAR device in which the apparatus can be used according to one embodiment.

FIG. 5 illustrates a LiDAR device in which the apparatus 100 can be used according to one embodiment.

The LiDAR device 500 can be a solid-state LiDAR device 501, which can measure distances to objects in an environment by illuminating the objects with laser pulses. Differences in return times of the reflected laser pulses and wavelengths can be used to create a point cloud of the environment. The point cloud can provide spatial location and depth information, for use in identifying and tracking objects.

As shown in FIG. 5, the LiDAR device 501 can include a laser pulse emitting unit 504, a laser pulse scanner 505, a laser pulse receiving unit 509, and a controlling unit 507. The laser pulse emitting unit 504 can include one or more laser emitters that emit beams of short pulses of laser light including photons of various frequencies.

The laser pulse emitting unit 504 emits a beam of outgoing laser pulses 513. In one embodiment, the laser pulse emit unit 403 can be implemented using the apparatus 100 as described in FIGS. 1-4. The beam of outgoing laser pulses 513 can be steered or scanned by the laser pulse scanner 505 in one or more directions using a variety of mechanisms, including MEMS mirrors, and one or more optical phased arrays (OPA). Each of the one or more directions can be referred to as a steering direction or a scanning direction. A vertical angle and a horizontal angle associated with each steering direction can be referred to as a steering angle or a scanning angle respectively. The laser pulse scanner 105 can steer one or more beams of laser pulses in a steering direction. Each beam of laser pulses can have a fixed number of pulses.

The controlling unit 507 can include control logic implemented in hardware, software, firmware, or a combination thereof. The controlling logic 507 can drive the other units or subsystems 504, 505 and 509 of the LiDAR device 501 in a coordinated manner, and can execute one or more data processing algorithms to perform one or more operations for signal filtering and object detection. For example, the controlling unit 507 can synchronize the laser pulse emitting unit 504 and the laser pulse scanner 505 so that the scanner pulse laser 505 can scan a horizontal field of view in multiple lines.

The laser light receiving unit 509 can collect one or more beams of laser pulses (e.g., beam of laser pulses 512) reflected from a target object 503 using one or more imaging lens (e.g., imaging lens 515), and focus the beams of laser pulses on one or more photodetectors (e.g., photodetector 517). Each photodetector can be a high-sensitivity photodiode, for example, a linear mode avalanche-photodiode (APD) or a single-photon avalanche diode (SPAD). The one or more photodetectors can convert photons in the reflected beam of laser pulses into electricity. The laser pulse receiving unit 509 can send returned signals incident on each photodetector to the controlling unit 507 for processing.

In one embodiment, laser diodes in the laser pulse emitting unit 504 can operate in a pulsed mode with a pulse repeating at a fixed interval (e.g., every few micro-seconds). The laser diodes and laser drive circuits for providing appropriate bias and modulation currents for the laser diodes can be chosen according to predetermined performance parameters of the LiDAR device 501. Examples of the performance parameters can include a required maximum range of scanned space and resolution.

Figure 6:
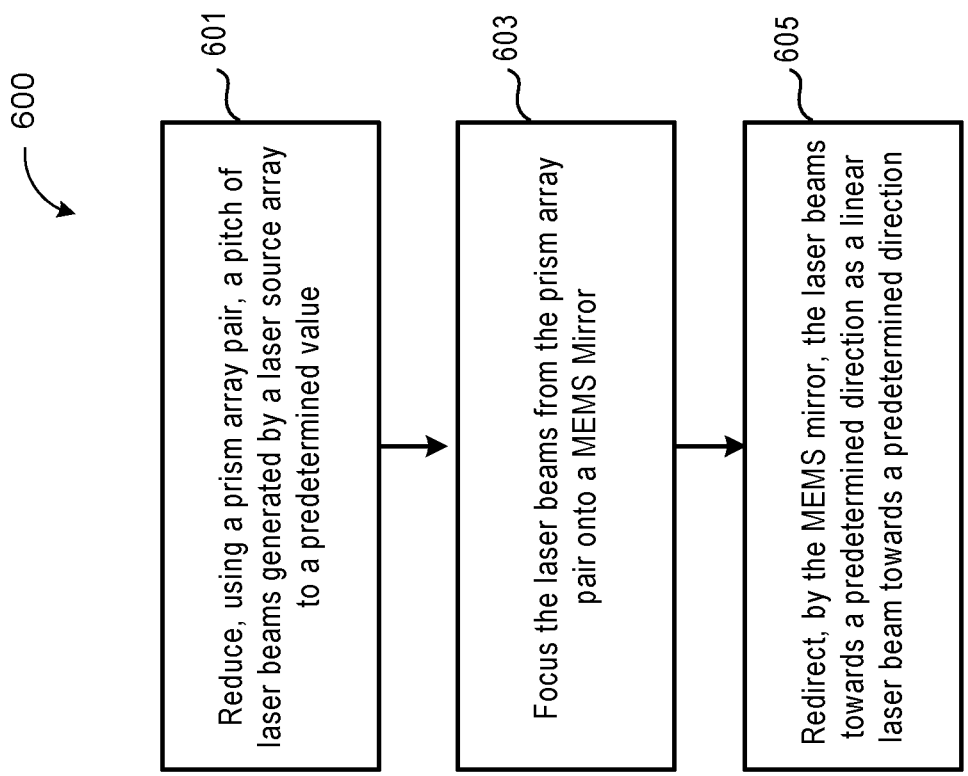
FIG. 6 illustrates a method of projecting a liner laser beam according to one embodiment.

FIG. 6 illustrates a method of projecting a linear laser beam according to one embodiment. As shown in FIG. 6, in block 601, a prism array pair reduces a pitch of laser beams generated by a laser source array to a predetermined value. The laser beams are collimated along the fast axis and are converted into parallel laser beams before reaching the prism array pair. The prism array pair can include two prism arrays that are separated by a spacing that is determined based on how much the pitch of the laser beams are to the reduced. In block 603, the laser beams from the prism array pair are focused by a cylinder lens onto a microelectromechanical system (MEMS). In block 605, the MEMS mirror redirects the laser beams converged thereon towards a predetermined direction as a linear laser beam.

Some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

All of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. An apparatus comprising:
   a laser source array;
   a prism array pair; and
   a first cylinder lens;
   wherein the prism array pair is positioned between the laser source array and the first cylinder lens to reduce a pitch between laser beams from the laser source array to a predetermined value, wherein a first prism array of the prism array pair is shaped as a piano-convex prism with a flat surface to receive collimated and parallel laser beams from a cylinder lens array; and
   wherein the first cylinder lens is to focus the laser beams from the prism array pair onto a microelectromechanical system (MEMS) mirror, which redirects the laser beams as a linear laser beam towards a predetermined direction.

2. The apparatus of claim 1, further comprising:
   a plurality of fast axis collimators (FACs), wherein each FAC is coupled with one of a plurality of laser sources in the laser source array to collimate a laser beam from the laser source along a fast axis.

3. The apparatus of claim 2, wherein the cylinder lens array is positioned between the plurality of FACs and the prism array pair to convert the collimated laser beam from the laser source into a parallel laser beam along a slow axis.

4. The apparatus of claim 3, wherein the first prism array and a second prism array of the prism array pair are separated by a spacing, wherein the spacing is based on a reduction of the pitch of the laser beams from the laser source array.

5. The apparatus of claim 1, further comprising: a shutter positioned before an iris to keep scattered light from the MEMS mirror.

6. The apparatus of claim 5, wherein the iris is positioned between the shutter and the MEMS mirror to block scattered light that the shutter fails to block.

7. The apparatus of claim 1, wherein the laser source array includes a plurality of laser sources, wherein each laser source includes a plurality of laser diodes, and is driven by a same voltage, or a different voltage.

8. A light detection and ranging (LiDAR) device that includes a laser pulse emitting unit, wherein the laser pulse emitting unit further includes:
- a laser source array;
- a prism array pair; and
- a first cylinder lens;
- wherein the prism array pair is positioned between the laser source array and the first cylinder lens to reduce a pitch between laser beams from the laser source array to a predetermined value, wherein a first prism array of the prism array pair is shaped as a piano-convex prism with a flat surface to receive collimated and parallel laser beams from a cylinder lens array; and
- wherein the first cylinder lens is to focus the laser beams from the prism array pair onto a microelectromechanical system (MEMS) mirror, which redirects the laser beams as a linear laser beam towards a predetermined direction.

9. The LIDAR device of claim 8, wherein the laser pulse emitting unit further includes:
- a plurality of fast axis collimators (FACs), wherein each FAC is coupled with one of a plurality of laser sources in the laser source array to collimate a laser beam from the laser source along a fast axis.

10. The LIDAR device of claim 9, wherein:
the cylinder lens array is positioned between the plurality of FACs and the prism array pair to convert the collimated laser beam from each laser source into a parallel laser beam along a slow axis.

11. The LiDAR device of claim 10, wherein the first prism array and a second prism array of the prism array pair are separated by a spacing, wherein the spacing is based on a reduction of the pitch of the laser beams from the laser source array.

12. The LIDAR device of claim 9, wherein the lase pulse emitting unit further includes:
a shutter positioned before an iris to keep scattered light from the MEMS mirror.

13. The LIDAR device of claim 12, wherein the iris is positioned between the shutter and the MEMS mirror to block scattered light that the shutter fails to block.

14. The LiDAR device of claim 9, wherein the laser source array includes a plurality of laser sources, wherein each laser source includes a plurality of laser diodes, and is driven by a same voltage, or a different voltage.

15. A method of projecting a linear laser beam, comprising:
- reducing, using a prism array pair, a pitch of laser beams generated by a laser source array to a predetermined value, wherein a first prism array of the prism array pair is shaped as a plano-convex prism with a flat surface to receive collimated and parallel laser beams from a cylinder lens array;
- focusing the laser beams from the prism array pair onto a microelectromechanical system (MEMS) mirror; and
- redirecting, by the MEMS mirror, the laser beams towards a predetermined direction as a linear laser beam towards a predetermined direction.

16. The method of claim 15, wherein the laser source array includes a plurality of laser sources, each laser source including a plurality of laser diodes packaged together, wherein each laser source is coupled with a fast axis collimator (FAC), which is to collimate a laser beam from the laser source along a fast axis.

17. The method of claim 15, wherein a cylinder lens array positioned between a plurality of fast axis collimator (FACs) and the prism array pair is configured to convert the collimated laser beam from each laser source into a parallel laser beam along a slow axis.

18. The method of claim 16, wherein a laser pulse emitting unit further includes:
a shutter positioned before an iris to keep scattered light from the MEMS mirror.

19. The method of claim 18, wherein the iris is positioned between the shutter and the MEMS mirror to block scattered light that the shutter fails to block.

20. The method of claim 16, wherein the laser source array includes a plurality of laser sources, wherein each laser source includes a plurality of laser diodes, and is driven by a same voltage, or a different voltage.

* * * * *